(12) United States Patent
Palanduz

(10) Patent No.: US 7,629,269 B2
(45) Date of Patent: Dec. 8, 2009

(54) HIGH-K THIN FILM GRAIN SIZE CONTROL

(75) Inventor: Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 11/096,315

(22) Filed: Mar. 31, 2005

(65) Prior Publication Data

US 2006/0220176 A1 Oct. 5, 2006

(51) Int. Cl.
*H01L 21/31* (2006.01)

(52) U.S. Cl. .............................. 438/761; 438/3; 438/396; 438/778; 257/310; 257/532; 257/E39.009; 257/E31.051; 977/773

(58) Field of Classification Search ................. 257/532, 257/E39.009, E31.051, 310; 438/3, 396, 438/778, 761; 361/311, 766; 977/773, 778, 977/784, 785, 786
See application file for complete search history.

(56) References Cited

U.S. PATENT DOCUMENTS

| 4,241,378 A | 12/1980 | Dorrian |
| 4,458,295 A | 7/1984 | Durschlag et al. |
| 4,528,613 A | 7/1985 | Stetson et al. |
| 4,687,540 A | 8/1987 | Singhdeo et al. |
| 4,702,967 A | 10/1987 | Black et al. |
| 5,065,275 A | 11/1991 | Fujisaki et al. |
| 5,155,655 A | 10/1992 | Howard et al. |
| 5,160,762 A | 11/1992 | Brand et al. |
| 5,172,304 A | 12/1992 | Ozawa et al. |
| 5,177,670 A | 1/1993 | Shinohara et al. |
| 5,191,510 A | 3/1993 | Huffman |
| 5,206,788 A | 4/1993 | Larson et al. |

(Continued)

FOREIGN PATENT DOCUMENTS

EP 0977218 A2 2/2000

(Continued)

OTHER PUBLICATIONS

Ohly, C., et al., "Defects in alkaline earth titanate thin films—the conduction behavior of doped BST," Integrated Ferroelectrics, 2001, vol. 38, pp. 229-237.

(Continued)

*Primary Examiner*—Matthew C Landau
*Assistant Examiner*—Colleen E Snow
(74) *Attorney, Agent, or Firm*—Blakely, Sokoloff, Taylor & Zafman LLP

(57) ABSTRACT

A method including depositing a suspension of a colloid comprising an amount of nano-particles of a ceramic material on a substrate; and thermally treating the suspension to form a thin film. A method including depositing a plurality of nano-particles of a ceramic material to pre-determined locations across a surface of a substrate; and thermally treating the plurality of nano-particles to form a thin film. A system including a computing device comprising a microprocessor, the microprocessor coupled to a printed circuit board through a substrate, the substrate comprising at least one capacitor structure formed on a surface, the capacitor structure comprising a first electrode, a second electrode, and a ceramic material disposed between the first electrode and the second electrode, wherein the ceramic material comprises columnar grains.

4 Claims, 6 Drawing Sheets

U.S. PATENT DOCUMENTS

| | | | |
|---|---|---|---|
| 5,504,993 | A | 4/1996 | Szerlip et al. |
| 5,745,334 | A | 4/1998 | Hoffarth et al. |
| 5,795,799 | A | 8/1998 | Hosoya |
| 5,796,572 | A | 8/1998 | Kawai |
| 5,800,575 | A | 9/1998 | Lucas |
| 5,889,647 | A | 3/1999 | Hansen et al. |
| 5,912,044 | A | 6/1999 | Farooq et al. |
| 5,952,040 | A | 9/1999 | Yadav et al. |
| 5,978,207 | A | 11/1999 | Anderson et al. |
| 5,989,935 | A | 11/1999 | Abbott et al. |
| 6,043,973 | A | 3/2000 | Nagashima et al. |
| 6,058,004 | A | 5/2000 | Duva et al. |
| 6,125,027 | A | 9/2000 | Klee et al. |
| 6,178,082 | B1 | 1/2001 | Farooq et al. |
| 6,180,252 | B1 | 1/2001 | Farrell et al. |
| 6,207,552 | B1 | 3/2001 | Hunt et al. |
| 6,214,445 | B1 | 4/2001 | Kanbe et al. |
| 6,216,324 | B1 | 4/2001 | Farooq et al. |
| 6,226,172 | B1 | 5/2001 | Sato et al. |
| 6,351,368 | B1 | 2/2002 | Kim |
| 6,366,444 | B1 | 4/2002 | Yagi |
| 6,372,286 | B1 | 4/2002 | Azuma et al. |
| 6,407,929 | B1 | 6/2002 | Hale et al. |
| 6,433,993 | B1 | 8/2002 | Hunt et al. |
| 6,437,970 | B1 | 8/2002 | Lee et al. |
| 6,477,034 | B1 | 11/2002 | Chakravorty et al. |
| 6,524,352 | B2 | 2/2003 | Adae-Amoakoh et al. |
| 6,541,137 | B1 | 4/2003 | Kingon et al. |
| 6,586,791 | B1* | 7/2003 | Lee et al. ................ 257/295 |
| 6,597,068 | B2 | 7/2003 | Petrarca et al. |
| 6,617,681 | B1 | 9/2003 | Bohr |
| 6,623,865 | B1 | 9/2003 | Zou et al. |
| 6,631,551 | B1 | 10/2003 | Bowles et al. |
| 6,638,378 | B2 | 10/2003 | O'Bryan et al. |
| 6,672,912 | B2 | 1/2004 | Figueroa |
| 6,678,145 | B2 | 1/2004 | Naito et al. |
| 6,775,150 | B1 | 8/2004 | Chakravorty et al. |
| 6,795,296 | B1 | 9/2004 | Palanduz et al. |
| 6,891,258 | B1 | 5/2005 | Alexander et al. |
| 6,907,658 | B2 | 6/2005 | Li |
| 6,909,593 | B2 | 6/2005 | Kuroda et al. |
| 6,937,035 | B2 | 8/2005 | Kawaike et al. |
| 6,980,416 | B2 | 12/2005 | Sakaguchi et al. |
| 7,038,235 | B2 | 5/2006 | Seitz |
| 7,072,167 | B2 | 7/2006 | Borland |
| 2001/0019144 | A1 | 9/2001 | Roy |
| 2001/0054748 | A1 | 12/2001 | Wikborg et al. |
| 2002/0058163 | A1 | 5/2002 | Uzoh |
| 2002/0080551 | A1 | 6/2002 | Kitagawa et al. |
| 2002/0081838 | A1 | 6/2002 | Bohr |
| 2002/0175402 | A1 | 11/2002 | McCormack et al. |
| 2003/0016026 | A1 | 1/2003 | Kawaike et al. |
| 2003/0039813 | A1 | 2/2003 | Kitai et al. |
| 2003/0136997 | A1 | 7/2003 | Shioga et al. |
| 2003/0170432 | A1 | 9/2003 | Kobayashi et al. |
| 2003/0174994 | A1* | 9/2003 | Garito et al. ................ 385/129 |
| 2003/0184953 | A1 | 10/2003 | Lee et al. |
| 2003/0207150 | A1 | 11/2003 | Maria et al. |
| 2003/0230768 | A1 | 12/2003 | Seitz |
| 2004/0027813 | A1 | 2/2004 | Li |
| 2004/0065912 | A1 | 4/2004 | Liu et al. |
| 2004/0081760 | A1* | 4/2004 | Burns et al. ................ 427/269 |
| 2004/0081811 | A1 | 4/2004 | Casper et al. |
| 2004/0089471 | A1 | 5/2004 | Andoh et al. |
| 2004/0126484 | A1 | 7/2004 | Croswell et al. |
| 2004/0175585 | A1 | 9/2004 | Zou et al. |
| 2004/0238957 | A1 | 12/2004 | Akram et al. |
| 2004/0257749 | A1 | 12/2004 | Otsuka et al. |
| 2005/0011857 | A1 | 1/2005 | Borland et al. |
| 2005/0118482 | A1 | 6/2005 | Sriramulu et al. |
| 2005/0151156 | A1 | 7/2005 | Wu et al. |
| 2005/0213020 | A1 | 9/2005 | Takeda et al. |
| 2006/0099803 | A1* | 5/2006 | Min ................ 438/643 |
| 2006/0143886 | A1 | 7/2006 | Srinivasan et al. |

FOREIGN PATENT DOCUMENTS

| | | |
|---|---|---|
| JP | 62250626 | 10/1987 |
| JP | 02-005507 | 1/1990 |
| JP | 03/178112 | 8/1991 |
| JP | 03208323 A | 9/1991 |
| JP | 05074651 | 3/1993 |
| JP | 07122456 | 12/1995 |
| JP | 2002-297939 | 10/2001 |
| JP | 2002075782 | 3/2002 |
| JP | 2002/305125 | 10/2002 |
| JP | 2002305125 | 10/2002 |
| JP | 2003163559 | 6/2003 |
| JP | 2003197463 | 7/2003 |

OTHER PUBLICATIONS

Ohly, C., et al., "High temperature conductivity behavior of doped $SrTiO_3$ thin films," Integrated Ferroelectronics, 2001, vol. 33, pp. 363-372.

Ohly, C., et al., "Electrical conductivity and segregation effects of doped $SrTiO_3$ thin films," Journal of European Ceramic Society, 21 (2001) 1673-1676.

PCT Search Report and Written Opinion for PCT Appln. No. PCT/US2005/037626, mailed May 8, 2006 (9 pages).

Office Action for U.S. Appl. No. 11/172,544, mailed Dec. 15, 2006 (12 pages).

Office Action for U.S. Appl. No. 10/974,139, mailed Dec. 13, 2006 (11 pages).

Office Action for U.S. Appl. No. 10/971,829, mailed Jan. 3, 2007 (8 pages).

Felten, J, et al.: Embedded Ceramic Resistors and Capacitors in PWB: Process and Performance, http://edc.ncms.org/ (2004) 7 pages.

Offerman, Se, et al.: Grain Nucleation and Growth During Phase Transformations, Science (2002) 298:1003-1005.

Office Action for U.S. Appl. No. 10/882,745, mailed Sep. 27, 2007 (15 pages).

Office Action for U.S. Appl. No. 10/974,139, mailed Oct. 9, 2007 (14 pages).

Office Action for U.S. Appl. No. 10/976,425, mailed Sep. 26, 2007 (10 pages).

Office Action for U.S. Appl. No. 11/096,313, mailed Oct. 18, 2007 (19 pages).

Office Action for U.S. Appl. No. 11/172,544, mailed Oct. 10, 2007 (16 pages).

Office Action for U.S. Appl. No. 10/882,745, mailed Mar. 17, 2005 (12 pgs).

Office Action for U.S. Appl. No. 10/882,745, mailed Oct. 4, 2005 (10 pgs).

Office Action for U.S. Appl. No. 10/882,745, mailed Apr. 3, 2006 (9 pgs).

Office Action for U. S. Appl. No. 10/882,745, mailed Aug. 30, 2006 (12 pgs).

Office Action for U.S. Appl. No. 10/882,745, mailed Jan. 10, 2007 (13 pgs).

Office Action for U.S. Appl. No. 10/882,745, mailed May 1, 2007 (12 pgs).

Office Action for U.S. Appl. No. 10/971,829, mailed Mar. 8, 2006 (8 pgs).

Office Action for U.S. Appl. No. 10/971,829, mailed Aug. 14, 2006 (8 pgs).

Office Action for U.S. Appl. No. 10/974,139, mailed Mar. 9, 2006 (10 pgs).

Office Action for U.S. Appl. No. 10/974,139, mailed Apr. 17, 2007 (12 pages).

Office Action for U.S. Appl. No. 10/976,425, mailed Mar. 26, 2007 (7 pgs).

Office Action for U.S. Appl. No. 11/096,313, mailed Aug. 14, 2006 (10 pgs).

Office Action for U.S. Appl. No. 11/096,313, mailed Nov. 29, 2006 (12 pgs).
Office Action for U.S. Appl. No. 11/096,313, mailed Feb. 20, 2007 (4 pgs).
Office Action for U.S. Appl. No. 11/096,313, mailed May 31, 2007 (16 pgs).
PCT International Search Report dated Nov. 4, 2005, PCT/US2005/022356, filed Jun. 23, 2005.
Article on the web on Answers.com about different ceramic material from Wikipedia <http://www.answers.com/topic/ceramics?cat=technology> (7 pages).
Imanaka, Yoshihiko et al., "Decoupling Capacitor with Low Inductance for High-Frequency Digital Applications," Fujitsu Sci. Tech. J., 38, 1, Jun. 2002, pp. 22-30.
Nagata, Hirotoshi et al., "Improvement of Bonding Strength Between Au/Ti and $SiO_2$ Films by Si Layer Insertion," J. Vac. Sci. Technol. A 17(3), May/Jun. 1999, pp. 1018-1023.
Voisard, Cyril et al., "Electrical Conductivity of Strontium Bismuth Titanate under Controlled Oxygen Partial Pressure," Journal of the European Ceramic Society, 19, 1999, pp. 1251-1254.
Yoo, Han-III et al., "Defect Structure and Chemical Diffusion in $BaTiO3$," Solid State Ionics 135, 2000, pp. 619-623.
Office Action for U.S. Appl. No. 11/172,544, mailed Apr. 19, 2007 (12 pages).
Intel Corporation, "Office Action mailed Jan. 16, 2008", U.S. Appl. No. 10/882,745.
Intel Corporation, Non-final Office Action mailed Jun. 12, 2008 for U.S. Appl. No. 10/976,425.
Intel Corporation, Final Rejection mailed Aug. 25, 2008: Korean Patent Application No. 10-2007-7007393.
Intel Corporation, Non-final Office Action mailed Aug. 20, 2008 for U.S. Appl. No. 11/929,788.
Intel Corporation, Final Office Action mailed Sep. 19, 2008 for U.S. Appl. No. 10/882,745.
Intel Corporation, "International Preliminary Report on Patentability (IPRP Chapter I) mailed Jan. 18, 2007", PCT/US2005/022356.
Intel Corporation, "International Preliminary Report on Patentability (IPRP Chapter I) mailed May 3, 2007", PCT/US2005/037626.
Intel Corporation, "International Preliminary Report on Patentability (IPRP Chapter I) mailed Oct. 11, 2007", PCT/US2006/012587.
Intel Corporation, "Non-final Office Action mailed Jan. 25, 2008" for U.S. Appl. No. 11/096,315.
Intel Corporation, "PCT Search Report and Written Opinion dated May 8, 2006", PCT/US2005/037626.
Intel Corporation, "PCT Search Report dated Aug. 1, 2006", PCT/US2006/012587, Form PCT/ISA/220.
Intel Corporation, Non final office action dated Feb. 5, 2009 for U.S. Appl. No. 11/972,579.
Intel Corporation, Final office action dated Jan. 30, 2009 for U.S. Appl. No. 10/976,425.
Intel Corporation, Japan office action dated Jan. 6, 2009 for JP2007-518288.
Intel Corporation, Non final office action dated Jan. 27, 2009 for U.S. Appl. No. 11/096,685.
Intel Corporation, Non final office action dated Jun. 25, 2009 for U.S. Appl. No. 11/891,443.
Intel Corporation, Chinese office action dated Apr. 20, 2009 for Chinese Patent Application No. 200580017468.0.
Pontes, F. M., et al., "Dielectric properties and microstructure of SrTiO3/BaTiO3 multilayer thin films prepared by a chemical role", Thin Solid Films, 385, (2001), 260-265.

* cited by examiner

HIGH-K THIN FILM GRAIN SIZE CONTROL

FIELD

Circuit structures and passive devices.

BACKGROUND

It is desirable to provide decoupling capacitance in a close proximity to an integrated circuit chip or die. The need for such capacitance increases as the switching speed and current requirements of chips or dies becomes higher. Thus, the need for a high number of passive components for high density integrated circuit chips or dies, the resultant increasing circuit density of printed wiring boards (PWB), and a trend to higher frequencies in the multi-gigaHertz range are among the factors combining to increase pressure on passive components surface-mounted on package substrates or PWBs. By incorporating embedded passive components (e.g., capacitors, resistors, inductors) into the package substrate or PWB, improved performance, better reliability, smaller footprint, and lower cost can be achieved.

Capacitors are the predominant passive component in most circuit designs. Typical materials for suitable embedded capacitor components, such as polymer and high-dielectric constant (high-k) ceramic powder composites or high-k ceramic powder and glass powder mixtures, are generally limited to a capacitance density on the order of nanoFarad/$cm^2$ and 0.1 microFarad/$cm^2$.

Creating thin films having a relatively large capacitance density, that is, a capacitance density greater or equal to one microFarad/$cm^2$, on metal sheets that may serve as conductor material presents a number of challenges. One way to achieve large capacitance density would be to achieve a large dielectric constant, given that capacitance density and dielectric constant are directly proportional to one another. It is known that the dielectric constant of a material is, among other things, a function of the grain size of that material. In particular, as the grain size of a material increases, generally, so will its dielectric constant. However, growing thin films having large grain sizes, that is, thin films having grain sizes above about 50 nanometers (nm) to about 100 nm is a challenge. For example, growing a large grain microstructure requires an optimum combination of nucleation and grain growth. This is hard to achieve on a polycrystalline metal sheet. Typically, the multitude of random sites on a polycrystalline metal sheet act as nucleation sites, resulting in a microstructure with very small grain size (about 10 nm to about 50 nm). Once the film microstructure is composed of a large number of small grains, further heating will generally not result in a large grain microstructure, because a large number of similar-sized grains cannot grow into each other to form larger grains.

Attempts at creating thin films having a large capacitance density have shifted toward reducing a thickness of the deposited thin film dielectric, while avoiding the problems noted above with respect to creating dielectrics of large grain size. Thus, the prior art typically focuses on relatively small grain sized thin film technology (that is dielectric thin films having grain sizes in the range from about 10 nm to about 50 nm, with dielectric constants ranging from about 100 to about 450). To the extent that the capacitance density of a material is known to be inversely proportional to its thickness, the prior art has aimed at keeping the thickness of such dielectric films on the order of about 0.1 microns. However, disadvantageously, such films have tended to present serious shorting issues. First, a surface roughness of the metal sheet onto which the dielectric film has been deposited, to the extent that it is usually significant with respect to a thickness of the dielectric film, tends to present peaks and valleys into the dielectric film which in turn can lead to a direct shorting between the electrodes of a capacitor that includes the dielectric film. In addition, again, since a thickness of the dielectric film is small, voids typically present in the film will allow metal from at least one of the capacitor electrodes to seep into the voids, leading to shorting and leakage between the electrodes.

Voids in dielectric layers are disadvantageous for a number of other reasons. First, because of the presence of air pockets brought about as a result of the presence of voids, stress concentration points are typically created in the dielectric film, thus increasing the risk of crack propagation therein. In addition, to the extent that the dielectric constant of air is very small, the presence of air pockets results in a decrease in the overall dielectric constant of the dielectric layer. Thus, voids present disadvantages with respect to both the mechanical integrity and the electrical performance of a dielectric layer. The prior art proposes solving the problem of voids by exposing the dielectric layer to relatively long periods of sintering in order to densify the layer. However, such a solution disadvantageously increases the thermal budget required for the fabrication of a dielectric film, increasing cost while not necessarily guaranteeing a satisfactory reduction in the number of voids.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
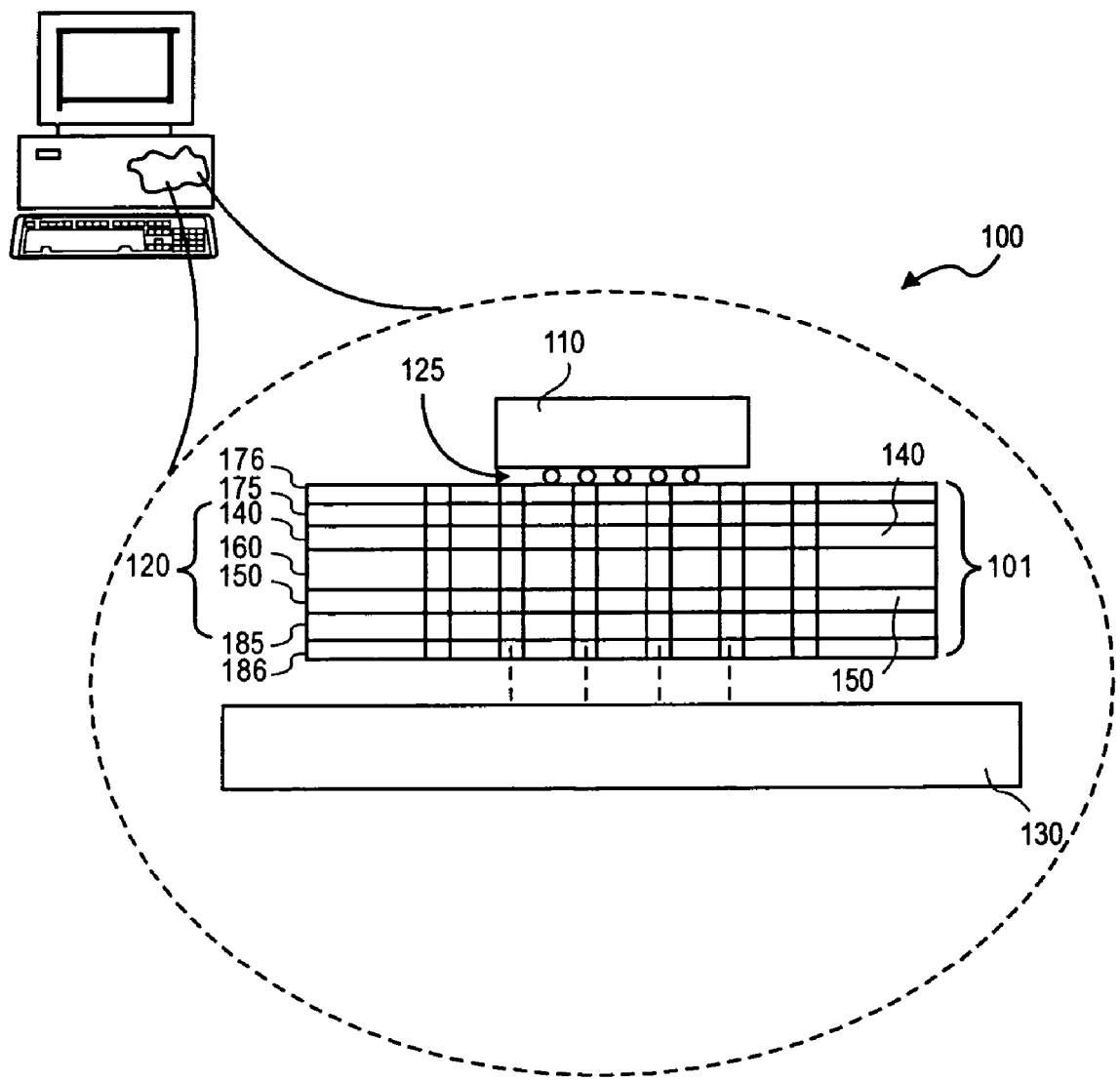
FIG. 1 shows a cross-sectional schematic side view of an embodiment of a chip or die package suitable for mounting on a printed circuit or wiring board.

FIG. 1 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanner, monitors, etc.), entertainment device (e.g., television, radio, stereo, tape and compact disc player, videocassette recorder, MP3 (Motion Picture Experts Group, Audio Layer 3) player, etc.), and the like. FIG. 1 illustrates the package as part of a desktop computer.

FIG. 1 shows electronic assembly 100 including die 110 physically and electrically connected to package substrate 101. Die 110 is an integrated circuit die, such as a processor die. Electrical contact points (e.g., contact pads on a surface of die 110) are connected to package substrate 101 through conductive bump layer 125. Package substrate 101 may be used to connect electronic assembly 100 to printed circuit board 130, such as a motherboard or other circuit board.

In one embodiment, package substrate 101 includes one or more capacitor structures. Referring to FIG. 1, package substrate 101 includes capacitor structure 140 and capacitor structure 150 embedded therein. Capacitor structure 140 and capacitor structure 150 are connected to opposite sides of core substrate 160. In another embodiment, capacitor structure 140 and capacitor structure 150 may be stacked one on top of the other.

In one embodiment, core substrate 160 is an organic core such as an epoxy including a fiberglass reinforced material, also called pre-preg. This configuration may be referred to as an integrated thin film capacitor (iTFC) system, where the capacitor(s) is(are) integrated into the package substrate rather than, for example, an interposer between the die and the package substrate. Overlying capacitor structure 140 is adhesion layer 175 (e.g., silica-filled epoxy). Underlying capacitor structure 150 is adhesion layer 185. Overlying adhesion layer 175 is build-up layer 176. Underlying adhesion layer 185 is build-up layer 186. Adhesion layer 175 and adhesion layer 185 act as adhesion layers to the overlying and underlying build-up layers 176 and 186, respectively. Each build-up layer includes traces (e.g., copper traces) for lateral translation of contact points between die 110 and package substrate 101, and package substrate 101 and printed circuit board 130, respectively, and typically solder resist as a top layer. The region made up of the combination of layers, 185, 150, 160, 140 and 175, is referred to herein as functional core 120.

Figure 2:
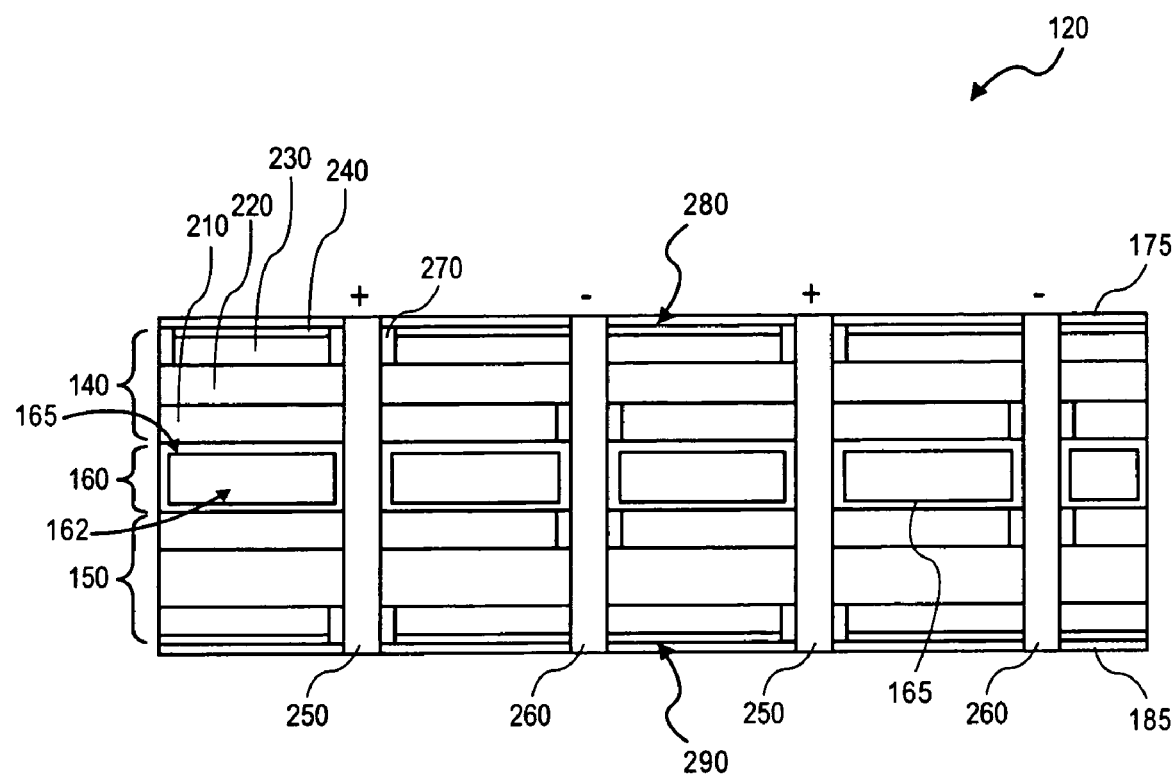
FIG. 2 shows a cross-sectional schematic side view of the package substrate of FIG. 1.

FIG. 2 shows a magnified view of a portion of functional core 120. Functional core 120 includes core substrate 160 having a thickness, in one embodiment, on the order of 200 microns (μm) to 700 μm. In another embodiment, core substrate 160 has a thickness on the order of 200 μm to 300 μm. In one embodiment, core substrate 160 includes core 162, such as a glass-fiber reinforced epoxy, and shell 165, such as a silica-particle filled epoxy.

Capacitor structure 140 is connected to one side of core substrate 160 (a top side as viewed). Capacitor structure 140 includes first conductor 210 proximal to core substrate 160 and second conductor 230. Disposed between first conductor 210 and second conductor 230 is dielectric material 220. Capacitor structure 150 is connected to an opposite side of core substrate 160 (a bottom side as viewed) and has a similar configuration of a dielectric material disposed between two conductors. Overlying capacitor structure 140 and capacitor structure 150 of functional core 120 (on sides opposite sides facing core substrate 160) is adhesion layer 175 and adhesion layer 185, respectively, made of, for example, an organic material and having a representative thickness on the order of 10 microns (μm) to 50 μm. Build-up layer 176 and build-up layer 186 of FIG. 1 would be deposited on these adhesion layers. As noted above, the build-up layers may include traces and contact points to connect package substrate to a chip or die and to a printed circuit board, respectively, and solder resist as a top layer.

In one embodiment, first conductor 210 and second conductor 230 of capacitor structure 140 are electrically conductive material. Suitable materials include, but are not limited to, a nickel or a copper material. In one embodiment, dielectric material 220 is a ceramic material having a relatively high dielectric constant (high-k). Suitable materials for dielectric material 220 include, but are not limited to, barium titanate ($BaTiO_3$), barium strontium titanate (($Ba$, $Sr$) $TiO_3$), and strontium titanate ($SrTiO_3$).

In one embodiment, capacitor structure 140 includes first conductor 210 and second conductor 220 having a thickness on the order of 20 μm to 50 μm, and dielectric material 220 of a high-k ceramic material of a thickness on the order of 1 μm to 3 μm and, in another embodiment, less than 1 μm. Capacitor structure 150, in one embodiment, is similar to capacitor structure 140.

In the embodiment of functional core 120 shown in FIG. 2, capacitor structure 140 includes overlayer 240 on second conductor 230. Overlayer 240 is an optional electrically conductive layer that may be used in an instance where second conductor 230 is a material that may not be compatible or may be less compatible with materials or processing operations to which functional core 120 may be exposed. For example, in one embodiment, second conductor 230 is a nickel material. To render functional core 120 transparent to subsequent processing operations or compatible with materials to which functional core 120 may be exposed, overlayer 240 is a copper material. Representatively, overlayer 240, if present, may have a thickness on the order of a few microns.

FIG. 2 shows a number of conductive vias extending through functional core 120 between surface 280 and surface 290. Representatively, conductive via 250 and conductive via 260 are electrically conductive materials (e.g., copper or silver) of suitable polarity to be connected to power or ground contact points of die 110 (e.g., through conductive bump layer 125 to contact pads on die 110 of FIG. 1). In this manner, conductive via 250 and conductive via 260 extend through capacitor structure 140, core substrate 160, and capacitor structure 150. Conductive vias 250 and 260 may be insulated, where desired, from portions of capacitor structure 140 or capacitor structure 150 by sleeves 270 of a dielectric material.

Figure 3:
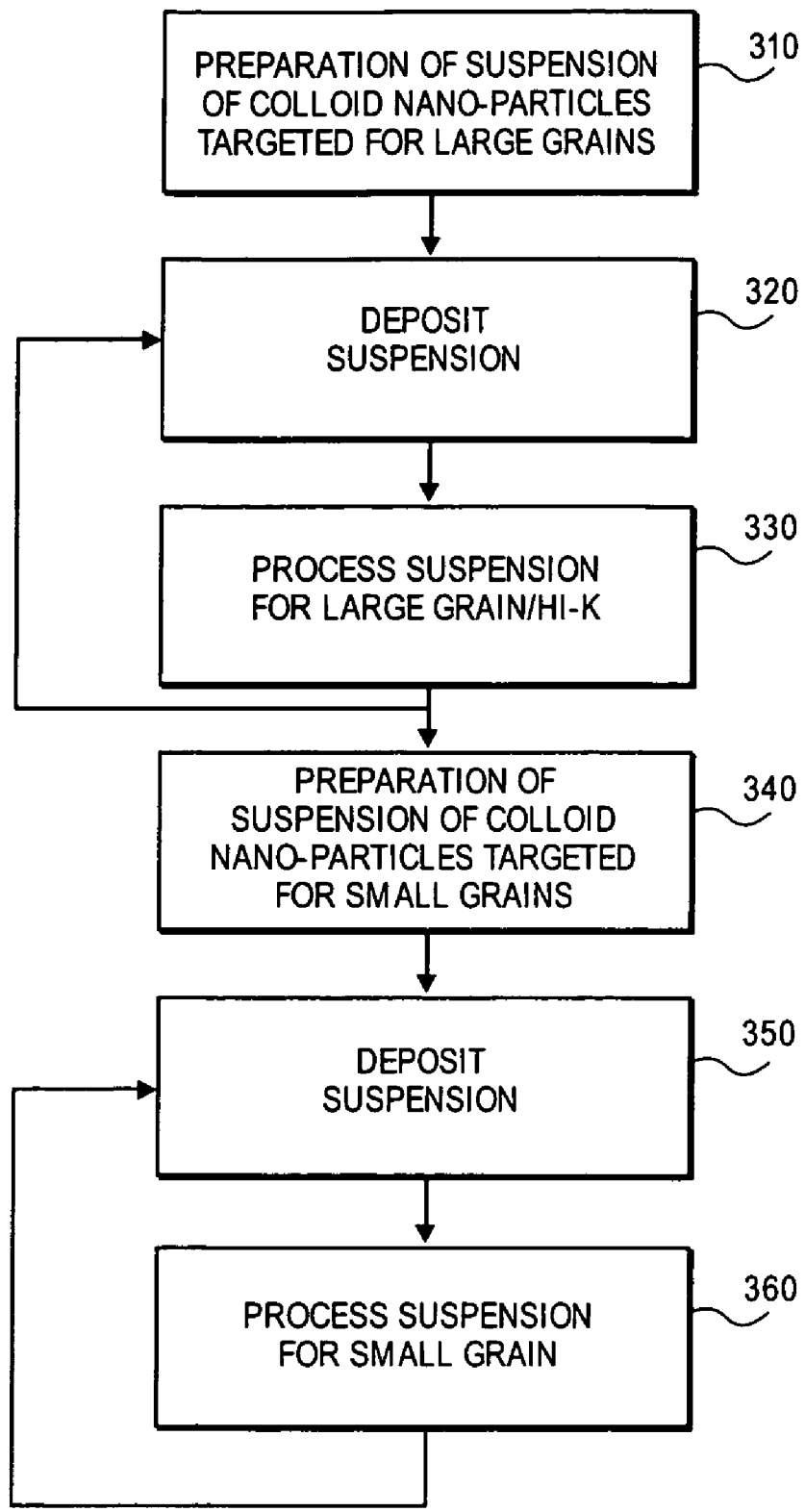
FIG. 3 describes a process flow for forming a dielectric film for a capacitor structure.

FIG. 3 presents a process for forming a capacitor structure such as capacitor structure 140 and capacitor structure 150. Specifically, FIG. 3 presents a process for forming a dielectric material of a capacitor structure (e.g., dielectric material 220 of capacitor structure 140). A capacitor structure, such as capacitor structure 140 and/or capacitor structure 150 may be formed and then separately connected to core substrate 160. FIGS. 4-9 show formation processes in connection with portions of the process flow described in FIG. 3, notably an embodiment of forming a capacitor structure.

In one embodiment of forming a capacitor structure of a package structure, a sheet (e.g., foil) of a first conductor material is provided as an initial substrate. Representatively, a sheet (e.g., foil) of nickel having a desired thickness is provided. Representative thicknesses are on the order of several microns to tens of microns depending on the particular design parameters. In one embodiment, the nickel sheet would be a standard rolled or plated nickel sheet. The dimensions of a sheet suitable as a first conductor may vary depending, for example, on the requirements of board shops involved in their production. For example, it may be desirable to process a sheet having a length and width dimension on the order of 200 millimeters (mm) to 400 mm from which a number of capacitor structures can be singulated. Individual capacitor could have sizes varying between silicon die dimensions to substrate dimensions.

A colloidal suspension of nano-sized particles is prepared (block 310). In one embodiment, the nano-sized particles are dielectric particles such as barium titanate ($BaTiO_3$) or barium, strontium titanate (BST). In one embodiment, the nano-sized particles are intended to serve as nucleation site for the formation of a film (e.g., a ceramic film). In one embodiment, suitable particles are particles having an average particle size of less than 10 nanometers (nm). In another embodiment, the particles have an average particle size on the order of 3 nm to 4 nm.

Representatively, the particles are disposed in a metal-organic solution, such as a sol gel. For a dielectric material of barium titanate, a suitable metal-organic sol-gel solution to form the dielectric material may, by way of example, include either: (1) barium acetate dissolved in acetic acid and mixed with titanium tetra-isopropoxide and isopropanol; (2) barium acetate dissolved in acetic acid mixed with titanium tetra n-butoxide stabilized with acetyl acetone and diluted with 2-methoxyethanol; and (3) barium propionate and titanium tetra n-butoxide stabilized with acetyl acetone dissolved with a mixture of propionic acid 1-butanol. To form a dielectric material of BST, strontium may also be added in any of the examples, for example, as a strontium acetate in Examples (1) and (2) or strontium propionate in Example (3).

A concentration of the nano-sized particles in the solution may be used to achieve thin film layers with different grain sizes. Generally speaking, the numbers of nano-sized particles in a solution to serve as nucleation sites may be related to a grain size. This is derived from a relationship:

$$V/n=v,$$

where V is the total volume of a film, n is the number of colloidal particles, each of which would act as a nucleus for grain growth, and v is the volume of film which would eventually evolve to the formation of a ceramic grain. To achieve relatively large grains of dielectric material and thus, a relatively high dielectric constant (e.g., on the order of 500 to 5000), the particles are minimized. Increasing the number of particles tends to decrease the grain size.

Figure 4:
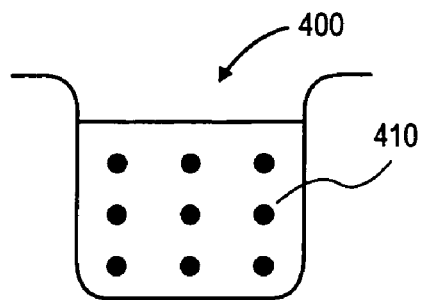
FIG. 4 shows a schematic side view of a container containing a metal-organic solution including a colloidal suspension of nano-sized particles targeted for a large grain ceramic film.

FIG. 4 shows container 400 including metal-organic solution 410 including nano-particles. A representative concentration of nano-particles in solution 410 is on the order of 1 particle per 100 micrometer$^3$ of sol-gel solution to target large grains.

Figure 5:
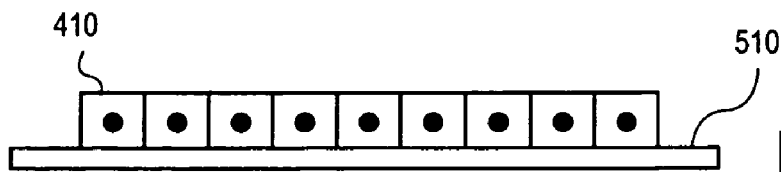
FIG. 5 shows a schematic side view of a first conductor sheet having a layer of the metal organic solution of FIG. 4 disposed on a surface thereof.

Referring again to FIG. 3, following the preparation of a suspension of colloid nano-particles in, for example, a metal-organic solution, the solution is deposited on a substrate (block 320). FIG. 5 shows solution 410 deposited on a surface substrate 510 that is, for example, a surface of a conductor of a capacitor, e.g., first conductor 210 of capacitor structure 140 (see FIG. 2). The solution may be deposited, for example, by spinning, spraying, or dipping techniques. In one embodiment, a metal-organic solution, such as a sol gel, with a suspension of colloid nano-particles, is deposited to a thickness on the order of 0.3 microns ($\mu m$) to one micron.

Referring again to FIG. 3, following the deposition on a substrate of a suspension of colloid nano-particles in a metal-organic solution, the suspension is processed (block 330). The solution is processed to dry and burn-out organics and to promote grain growth. For drying, the solution may be exposed to temperatures of 100° C. to 200° C. for 15 minutes to 30 minutes. For organic burn-out, the dried film may be exposed to temperatures on the order of 300° C. to 500° C. for about one hour to three hours to yield an intermediate film. Following organic burn-out, the film may be exposed to a relatively high temperature, e.g., on the order of 700° C. or greater (e.g., 700 to 1,000° C.) for a period of one half hour to three hours.

Figure 6:
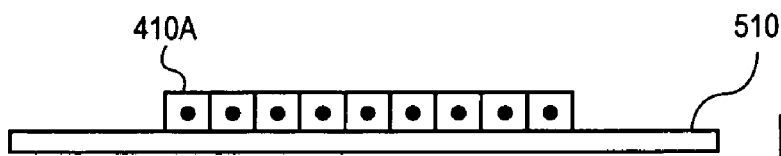
FIG. 6 shows the structure of FIG. 5 following the thermal processing of the metal organic solution.

FIG. 6 shows film 410A on a surface of substrate 510 following drying and burn-out. The heat treatment promotes grain growth with the nano-particles in the solution serving as nucleation sites. In one embodiment, the heat treatment is done in an oxygen atmosphere to promote oxidation of the metal components of the metal-organic solution and the formation of ceramic grains. As noted above, by controlling the concentration of the particles in the original solution (e.g., solution 410), the number of grains that will be present in the film as well as the grain size may be controlled. In one embodiment, film 410A is controlled in a manner to produce large grains (e.g., grains of $BaTiO_3$ or BST on the order of at least 50 nanometers) to form a high-K film.

Figure 8:
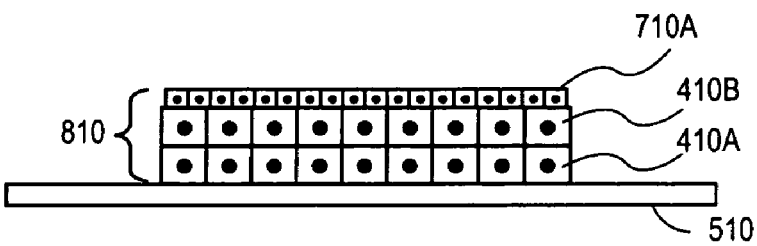
FIG. 8 shows the structure of FIG. 6 following the introduction and thermal processing of a second film from the solution of FIG. 4 and a film from the solution of FIG. 7.

Referring again to FIG. 3, following processing of the suspension of colloid nano-particles in a metal-organic solution to form a film having relatively large grains, another layer of thin film may be formed from the same solution (e.g., solution 410 in FIG. 4). Reasons for depositing an additional thin film include, but are not limited to, substrate roughness, dust particle size in a clean room environment, or leakage suppression. A film may be formed using process operations described with reference to block 320 and block 330 of FIG. 3. FIG. 8, described in detail below, shows the structure having film 410A and film 410B on a surface of film 410A and, in one embodiment having characteristics (e.g., grain size, dielectric constant) similar to film 410A.

Referring again to FIG. 3, a different suspension of colloid nano-particles may be prepared (block 340). In one embodiment, a metal-organic solution, such as a sol gel, with a suspension of colloid nano-particles may be prepared that targets a smaller grain size of a resulting film. One reason for forming a film of smaller grain is to serve as filling material to seal the porosity/pin holes/cracks that typically exist in films of larger grains. In terms of thin film capacitors, the addition of a dielectric filling material of small grains may serve to minimize possible shorting between conductors of a capacitor. Such a small-grain film may be deposited to a thickness so that the contribution of the small-grain film to the overall dielectric constant of the composite dielectric film is minimized (e.g., a thin film).

One way to form a solution with a suspension of colloid nano-particles targeted for smaller grains is similar to that described above with respect to solution 410 (FIG. 4) and to increase the concentration of the nano-particles in the solution, relative to a solution targeted for larger grains (e.g., high-K). A representative concentration of nano-particles is on the order of one particle per 10 micrometer$^3$ of sol-gel solution for a solution containing $BaTiO_3$ or BST nano-particles targeted for small grains.

Figure 7:
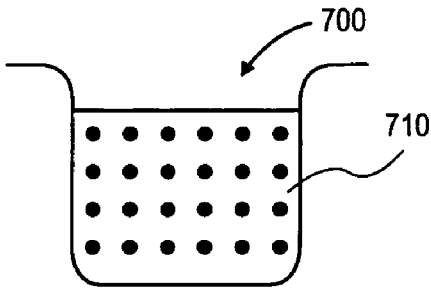
FIG. 7 shows a schematic side view of a container containing a metal-organic solution including a colloidal suspension of nano-sized particles targeted for a small grain ceramic film.

FIG. 7 shows container 700 including metal-organic solution 710, such as a sol gel, with a suspension of nano-particles targeted for small grains. Solution 710 may be similar to solution 410 (FIG. 4) albeit with a larger concentration of nano-particles.

Referring to FIG. 3, following the preparation of a solution including a suspension of colloid nano-particles targeted for small grains, the solution is deposited onto the underlying thin film layer (block 350). FIG. 8 shows substrate 510 having film 410A and film 410B (overlying film 410A) on a surface of substrate (conductor) 510. On a surface of film 410B, solution 710 is deposited, for example, by spinning, spraying or dipping.

Following the deposition of a solution including a suspension of colloid nano-particle targeted for small grains, the suspension is processed into a film. The processing operation(s) may be similar to those described above with respect to forming film 410A including drying and burning-out organics. The nano-particles of the solution act as nucleation sites that, in the presence of increased temperature and an oxygen atmosphere, promote grain growth. FIG. 8 shows film 710A overlying a surface of film 410B.

Referring again to FIG. 3, following the processing of a suspension for small grain growth, another film may be formed having small grains by repeating the operation described in block 350 and block 360. Alternatively, composite dielectric film 810 (including film 410A, 410B, and 710A (see FIG. 8)) may be complete and subsequent processing operations to form a capacitor may be followed.

Figure 9:
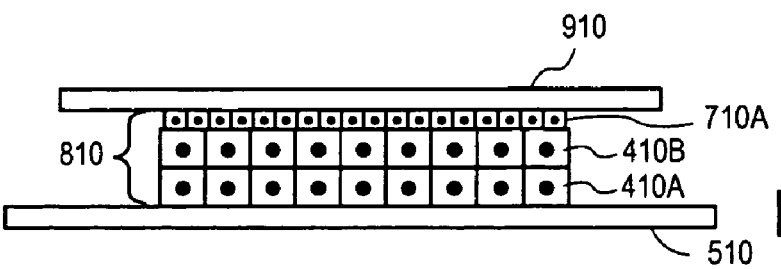
FIG. 9 shows the structure of FIG. 8 following the formation of a second conductor on the dielectric material.

Referring to FIG. 9, following the formation of a dielectric film made up, for example, of film 410A, film 4101B and 710A, a second conductor may be deposited on a surface (an exposed surface) of composite film 810 (e.g., a surface opposite substrate 510). FIG. 9 shows a structure of FIG. 8 following the formation of second conductor 910. In one embodiment, second conductor 910 is a material similar to substrate (first conductor) 510, such as a nickel material that may be deposited on composite dielectric film 810 as a paste and thermally treated. Alternatively, second conductor 910 of a nickel material may be laminated to composite dielectric film 810.

For completeness, various subsequent processing operations are described to form a package substrate (e.g., package substrate 101 in FIG. 1) utilizing a capacitor structure or structures formed according to the method of FIG. 3 and illustrated in FIGS. 4-6. As noted above, in one embodiment, first conductor 410 and second conductor 440 are a nickel material. Copper coating may be desirable to make the capacitor structure transparent to subsequent processing operations to which the capacitor structure or the package substrate may be exposed. In the example where first conductor 410 and second conductor 440 are a nickel material, for example, it may be desirable to coat an exposed surface of the first or second conductor with a copper material.

The capacitor structure may be attached to a core substrate, such as an organic core substrate as discussed above. In the example where a copper layer overlays a conductor, the copper surface may need to be roughened (e.g., by etching) in order to enhance lamination. The capacitor structure may be attached to one surface of the base substrate. A separate capacitor structure formed in a similar manner could be laminated to another surface, such as shown above in FIG. 2 and described in the accompanying text.

Following laminating of one or more capacitor structures to a core substrate, the package substrate may be patterned. Conventional patterning operations, such as mechanical drilling, drilling via holes in epoxy with laser, lithography and copper plating operations used in via formation may be employed. The capacitor structure may also be patterned to form individual capacitors. A complete organic substrate may be formed by adding build-up layers of an organic material (e.g., epoxy or glass particle-filled epoxy) onto the substrate.

FIGS. 10-14 describe another technique for forming a dielectric film on a substrate, such as a dielectric film for a capacitor (e.g., a thin film capacitor). In this technique, the dielectric material is deposited through a patterned mask on a substrate, such as a capacitor electrode.

Figure 10:
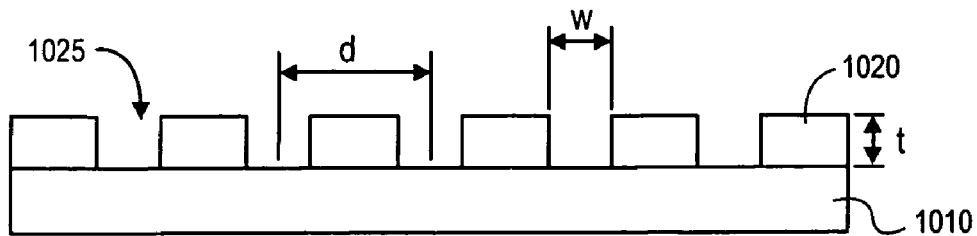
FIG. 10 shows a schematic side view of a substrate such as a conductive foil having a mask with openings to a surface of the substrate.

Referring to FIG. 10, in one embodiment of forming a capacitor structure of a package structure, a sheet (e.g., foil) of a first conductive material is provided as an initial substrate. Representatively, substrate 1010 is a sheet (e.g., foil) of nickel having a desired thickness, such as on the order of several microns to tens of microns depending on design parameters is provided.

Mask 1020 is formed on a surface of substrate 1010. In one embodiment, mask 1020 is a conventional lithographic mask, such as a positive or negative photoresist material. In such case, the mask may be patterned using light energy. Alternatively, a mask may be formed of a material where openings in the mask may be achieved using a laser (e.g., laser drilling). In one embodiment, mask 1020 is formed on a surface of substrate 1010 to a thickness, t, on the order of 0.25 microns. A mask is patterned, in one embodiment, to have openings having a width, w, on the order of 0.25 microns and a distance, d, between openings on the order of one micron. Openings 1025 to a surface of substrate 1010 provides nucleation site where dielectric material may be deposited and processed for grain growth, including oriented grain growth.

In one embodiment, a colloidal suspension of nano-size particles is prepared. The preparation may be similar to that described above with reference to FIG. 4 and the accompanying text. Thus, in one embodiment, the nano-sized particles are dielectric particles such as BaTiO3 or BST representatively disposed in a metal-organic solution such as a sol gel. In another embodiment, a suitable composition may comprise the metal-organic solution without the particles.

Figure 11:
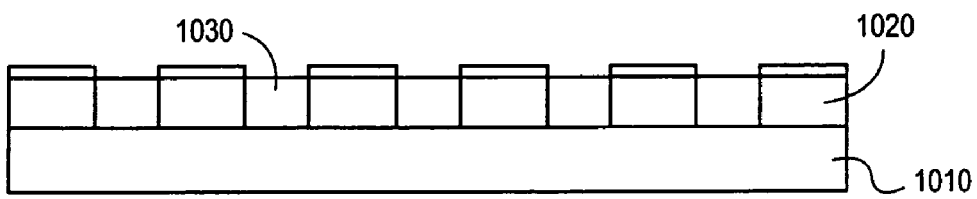
FIG. 11 shows the structure of FIG. 10 following the deposition of a metal-organic solution on the substrate.

FIG. 11 shows the structure of FIG. 10 following the deposition of a metal-organic solution such as a sol gel. FIG. 11 shows solution 1030 deposited over a surface of substrate 1010 having mask 1020 thereon. Metal-organic solution 1030 is shown deposited (e.g., such as by spinning, spraying or dipping) over the mask and openings 1025 to a surface of substrate 1010. Although described as a chemical solution deposition (CSD), it is appreciated, that the nano-sized particles may be deposited by other techniques, such as physical vapor deposition (PVD). Following the deposition of the nano-sized particles, excess material may be removed from an upper surface of mask 1020 and mask 1020 may be removed. Following removal of the mask, the nano-sized particles may be thermally annealed to dry and burn-out organics and crystallize the nuclei. In the example where the nano-sized particles are dielectric particles of BaTiO₃ or BST, the anneal may be done in an atmosphere with controlled partial pressure of oxygen.

Figure 12:
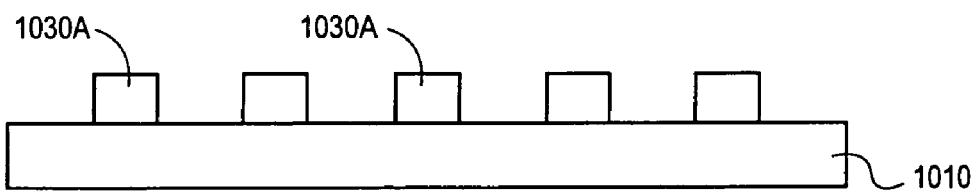
FIG. 12 shows the structure of FIG. 10 following the removal of the mask and processing of the solution.

FIG. 12 shows the structure of FIG. 11 following the crystallization of dielectric particles. FIG. 12 shows crystallized nuclei 1030A formed on a surface of substrate 1010 in the openings provided by mask 1020. Following the crystallization of nuclei 1030, additional dielectric material, such as a sol gel of dielectric material, possibly free of nano-sized particles, is deposited over a surface of substrate 1010 corresponding to the surface containing nuclei 1030. For a dielectric material of BaTiO₃ or BST, a sol gel may be prepared as described above (see FIG. 4 and the accompanying text). The structure may then be annealed to crystallize the subsequent deposit.

Figure 13:
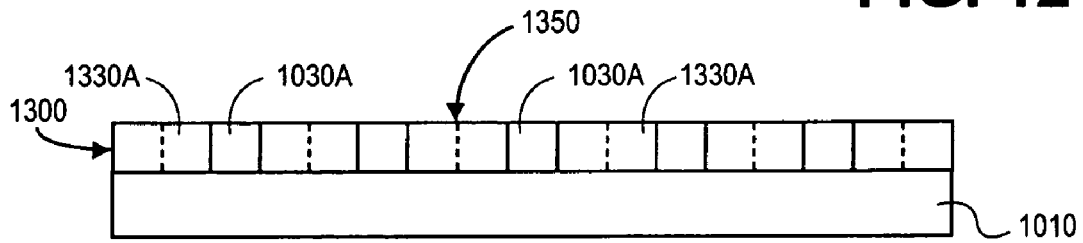
FIG. 13 shows the structure of FIG. 12 following the introduction and processing of a second metal-organic solution on the substrate.

FIG. 13 shows the structure of FIG. 12 following the deposition and crystallization of additional film material. FIG. 13 shows film 1300 of nuclei 1030A and crystals (e.g., dielectric crystals) 1330A adjacent nuclei 1030. FIG. 13 also shows grain boundaries 1350 disposed in the film as a function of grain growth of crystals from nuclei 1030A. The presence of nuclei 1030A to promote grain growth may also serve to orient the grains of film 1300. For example, an opening, with a very low aspect ratio (ratio of depth to width), in mask 1020 (see FIG. 10) may serve as a filter to allow only single crystal to emerge from an opening. This may lead to columnar grain. The location of the openings in the mask relative to one another may orient the grain growth throughout the film.

Figure 14:
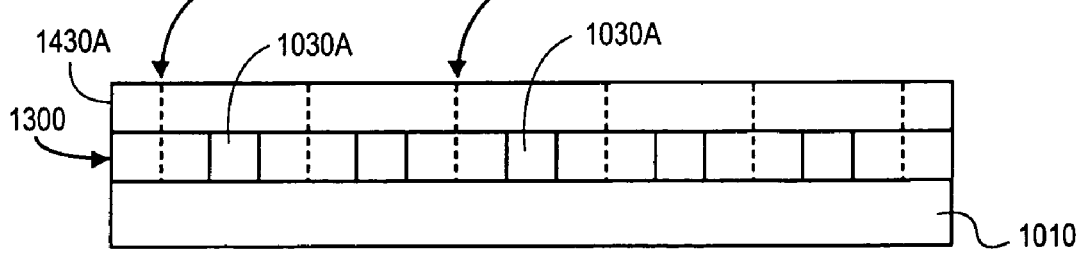
FIG. 14 shows the structure of FIG. 12 following the introduction and processing of a third metal-organic solution on the substrate.

FIG. 14 shows the structure of FIG. 13 following the optional deposition of additional dielectric material, such as a sol gel. FIG. 14 shows crystallized film 1430A formed over film 1300. In one embodiment, the orientation of crystals in film 1300 continues into film 1430A, including oriented grain boundaries. In one embodiment, the mask, used to pattern the film 1430A, can have openings with different dimensions and different pitch, which could lead to a film 1430A with different grain size from that of the underlying film 1300.

As noted above with respect to FIG. 9 and the accompanying text, following the formation of a film (e.g., a composite film), such as a dielectric film including film 1300 and film 1430A, on a conductor, a subsequent conductor material may be deposited over the dielectric film to form a capacitor.

FIGS. 15-20 describe another embodiment of forming a film on a substrate, such as a dielectric film on a conductor as part of the formation of a capacitor structure. In this technique, a substrate, such as an electrode is patterned in order to nucleate grain growth and control the grain size/microstructure of, for example, a dielectric film.

Figure 15:
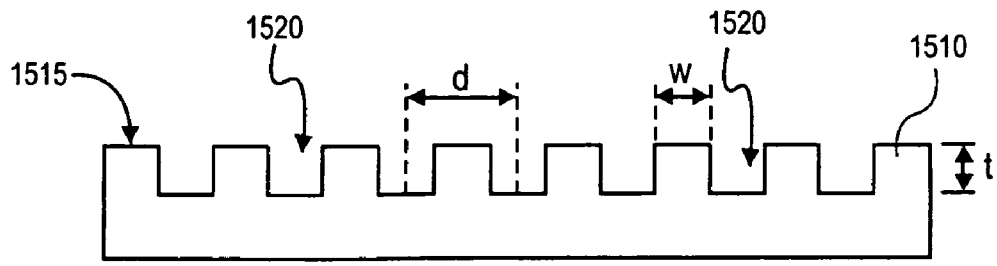
FIG. 15 shows a schematic side view of a substrate such as a conductive sheet having a surface with openings formed therein.

FIG. 15 shows substrate 1510 that is, for example, a conductor of a capacitor structure. Representatively, substrate 1510 is a sheet (e.g., foil) of a conductive material such as nickel or copper. On a surface of substrate 1510 is formed openings 1520 that will serve as micro-crucibles for crystal nuclei growth. Representatively, openings 1520 have a depth, t, on the order of 0.25 microns and a width, w, on the order of 0.25 microns. Representatively, openings 1520 may be positioned across a surface area of substrate 1510 with a distance, d, between openings 1520 on the order of one micron. Openings 1520 may be formed by various techniques, including wet-etching (e.g., photolithographic etching), dry-etching (e.g. plasma etching), etc.

Figure 16:
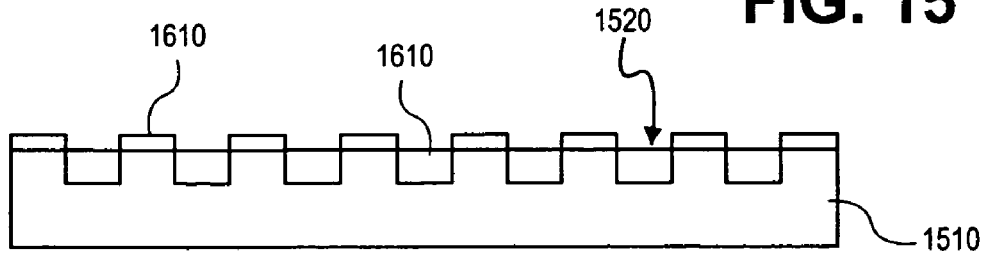
FIG. 16 shows the structure of FIG. 15 following the deposition of a metal-organic solution in the openings of the substrate.

FIG. 16 shows the structure of FIG. 15 following the deposition of dielectric material 1610 over a surface of substrate 1510 including openings 1520. Representatively, dielectric material 1610 may be a metal-organic solution, such as a sol gel similar to that described above with reference to FIG. 3 and FIG. 4 and the accompanying text. The metal-organic solution may include nano-sized particles, such as particles of BaTiO₃ or BST. Such solution may be deposited through chemical solution deposition (CSD). Alternatively, solution 1610 may be deposited by PVD or other vapor deposition techniques. Dielectric material 1610 is deposited over a surface of substrate 1510 including in openings 1520.

Figure 17:
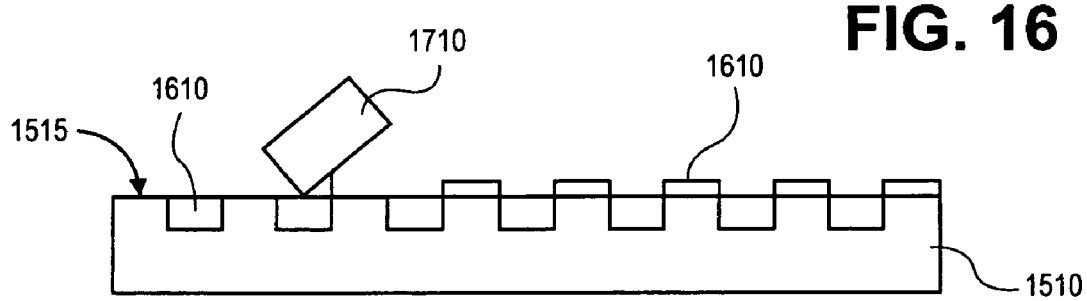
FIG. 17 shows the structure of FIG. 16 during removal of excess solution from the structure.

Following the deposition of dielectric material 1610 on a surface of substrate 1510, surface 1515 is wiped to a remove the deposit from surface 1515. Dielectric material 1610 remains in openings 1520. Suitable techniques to remove excess material from surface 1515 include the use of a sponge or squeegee 1710. FIG. 17 shows the wiping operation.

Figure 18:
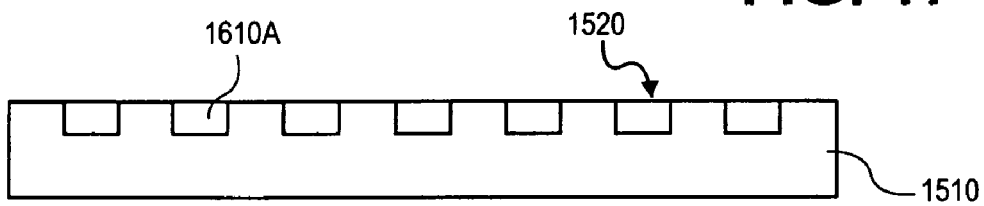
FIG. 18 shows the structure of FIG. 17 following the processing of the metal-organic solution in the openings of the substrate.

FIG. 18 shows the structure of FIG. 17 following the crystallization of the dielectric material in openings 1520. The dielectric material may be annealed at a temperature sufficient to dry the material and burn-out organics and promote crystallization growth. FIG. 18 shows crystal nuclei 1610A in openings 1520. It is appreciated that the aspect ratio of openings 1520 contribute to the grain size of the material. In one embodiment, an aspect ratio (depth/diameter) of openings 1520 is selected to serve as a filter to allow only a single crystal to emerge from the opening. Such control may lead to a control of the location of the grains on a surface of substrate 1510 as well as the grain size. In one embodiment, the aspect ratio may lead to columnar grains.

Figure 19:
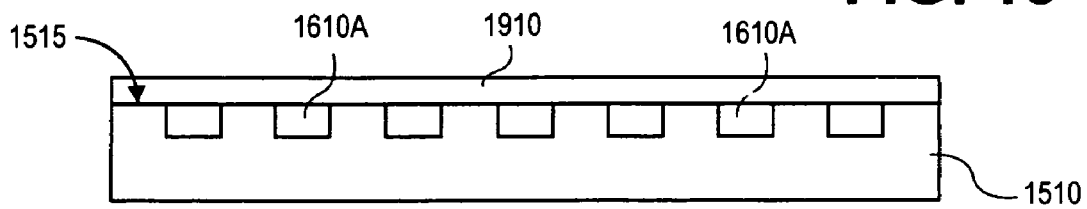
FIG. 19 shows the structure of FIG. 18 following the deposition of additional metal-organic solution on the substrate.

The presence of nuclei 1610A in openings 1520 will serve as nucleation sites for crystallization/grain growth of a subsequently deposited dielectric film. FIG. 19 shows dielectric material 1910, such as a sol gel for BaTiO₃ or BST formed on surface 1515 of substrate 1510. Dielectric material 1910 may be deposited by CSD or PVD or similar techniques.

Figure 20:
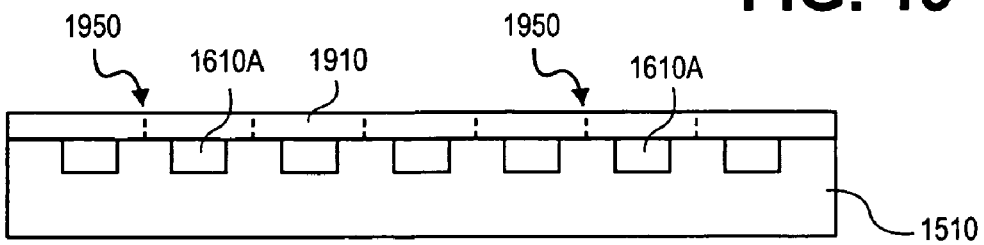
FIG. 20 shows the structure of FIG. 19 following the processing of the additional metal-organic solution.

FIG. 20 shows the structure of FIG. 19 following the crystallization of dielectric material 1910 to form film 1910A. Grain growth in film 1910A, in one embodiment, is catalyzed by the presence of nuclei 1610A in openings 1520 of substrate 1510. FIG. 20 also shows grain boundaries 1950 formed in film 1910A. In one embodiment, the location of nuclei 1610A may control the grain growth and produce columnar grains.

Following the formation of film 1910A, one or more subsequent films of dielectric material may be introduced where desired. Following the formation of a dielectric film, a second conductor may be placed over the composite dielectric film (e.g., over exposed surface of film 1910A) to form a capacitor structure.

The above description is related to forming capacitor structures within package substrates. Similar techniques may be used in the formation of capacitors in other environments, such as in printed wiring boards (e.g., printed circuit boards).

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
   depositing a first suspension of a colloid comprising an amount of nano-particles of a ceramic material on a substrate;
   thermally treating the first suspension to form a first thin film;

after thermally treating the first suspension, depositing a second suspension comprising a colloid comprising an amount of nano-particles of a ceramic material on the first thin film; and thermally treating the second suspension, wherein the first suspension and the second suspension are from the same solution, and wherein thermally treating the second suspension forms a second thin film on the first film having a similar dielectric constant, a similar grain size, a smoother surface, fewer dust particles, and less leakage than the first thin film.

2. A method comprising:

depositing a first suspension of a colloid comprising an amount of nano-particles of a ceramic material on a substrate;

thermally treating the first suspension to form a first thin film;

after thermally treating the first suspension, depositing a second suspension comprising a colloid comprising an amount of nano-particles of a ceramic material on the first thin film; and thermally treating the second suspension, wherein the concentration of the nano-particles in the second suspension is selected to obtain a film of a ceramic material comprising a dielectric constant that is less than the film of the ceramic material formed from the first suspension, wherein depositing the second suspension comprises depositing a volume selected to form a second film wherein a contribution of a dielectric constant of the second film is minimized relative to a contribution of a dielectric constant of the first film, and wherein the first thin film comprises grains of dielectric material having a first size, the second film comprises grains of dielectric material having a second size, and the second size is sufficiently smaller than the first size to cause the second film to serve as filling material to seal the first film.

3. The method of claim 2, wherein the concentration of nanoparticles in the first suspension is selected to be fewer that the concentration of nanoparticles in the second suspension; to cause the first film to have a dielectric constant on the order of 500 to 5,000; and to cause the second film to seal porosity, pinholes, and cracks that exist in the first film.

4. A method comprising:

forming a mask on a surface of a substrate, the mask selected to have openings corresponding to pre-determined locations;

depositing a plurality of nano-particles of a ceramic material to the pre-determined locations;

thermally treating the plurality of nano-particles to form a thin film, wherein depositing a plurality of nano-particles comprises depositing a first plurality of nano-particles, the method further comprising:

after thermally treating the first plurality of nano-particles, depositing a second plurality of nano-particles of a ceramic material; and thermally treating the second plurality of nano-particles, and wherein thermally treating the second plurality of nanaoparticles includes forming a second film where the mask has been removed between the openings; and includes using the first plurality of nanoparticles as nuclei to promote grain growth of the second film, orient grains of the second film, and form grain boundaries with the second film.

* * * * *

UNITED STATES PATENT AND TRADEMARK OFFICE
CERTIFICATE OF CORRECTION

PATENT NO. : 7,629,269 B2 Page 1 of 1
APPLICATION NO. : 11/096315
DATED : December 8, 2009
INVENTOR(S) : Cengiz A. Palanduz It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 838 days.

Signed and Sealed this

Twenty-first Day of December, 2010

David J. Kappos
*Director of the United States Patent and Trademark Office*